United States Patent
Hofer et al.

(10) Patent No.: US 11,831,149 B2
(45) Date of Patent: Nov. 28, 2023

(54) AFCI SELF TEST

(71) Applicant: Fronius International GmbH, Pettenbach (AT)

(72) Inventors: Bernd Hofer, Pettenbach (AT); Stefan Breuer, Pettenbach (AT); Christian Fasthuber, Pettenbach (AT); Walter Spitzer, Pettenbach (AT); Andreas Hofer, Pettenbach (AT)

(73) Assignee: FRONIUS INTERNATIONAL GMBH, Pettenbach (AT)

( * ) Notice: Subject to any disclaimer, the term of this patent is extended or adjusted under 35 U.S.C. 154(b) by 428 days.

(21) Appl. No.: 17/280,250

(22) PCT Filed: Sep. 26, 2019

(86) PCT No.: PCT/EP2019/076028
§ 371 (c)(1),
(2) Date: Mar. 26, 2021

(87) PCT Pub. No.: WO2020/064926
PCT Pub. Date: Apr. 2, 2020

(65) Prior Publication Data
US 2022/0006282 A1 Jan. 6, 2022

(30) Foreign Application Priority Data
Sep. 28, 2018 (EP) .................... 18197525

(51) Int. Cl.
*H02H 3/00* (2006.01)
*H02H 3/33* (2006.01)
(Continued)

(52) U.S. Cl.
CPC .............. *H02H 3/33* (2013.01); *G01R 31/52* (2020.01); *H02H 1/0015* (2013.01)

(58) Field of Classification Search
None
See application file for complete search history.

(56) References Cited

U.S. PATENT DOCUMENTS

| 4,688,133 A | * | 8/1987 | Freeman | ............... H01H 47/22 361/45 |
| 9,897,642 B1 | | 2/2018 | Johnson | |

(Continued)

FOREIGN PATENT DOCUMENTS

| CA | 2256210 | 6/1999 |
| CN | 201051651 | 4/2008 |

(Continued)

OTHER PUBLICATIONS

Int'l Search Report (Form PCT/ISA/210) conducted in Int'l Appln. No. PCT/EP2019/076028 (dated Nov. 6, 2019).

(Continued)

*Primary Examiner* — Stephen W Jackson
(74) *Attorney, Agent, or Firm* — GREENBLUM & BERNSTEIN, P.L.C.

(57) ABSTRACT

To recognize a fault in an arrangement including a transformer having a primary winding connected in series with a DC voltage line and a secondary winding coupled magnetically to the primary winding, and including an evaluation unit that processes a secondary signal on the secondary winding, a signal component at at least one frequency is determined from the secondary signal and a signal level of the signal component is compared with a signal threshold. The fault is detected when the signal level falls below the signal threshold.

17 Claims, 7 Drawing Sheets

(51) Int. Cl.
     *G01R 31/52*     (2020.01)
     *H02H 1/00*     (2006.01)

(56)     References Cited

U.S. PATENT DOCUMENTS

| | | | |
|---|---|---|---|
| 2015/0214719 A1* | 7/2015 | Aromin | H01R 13/7135 |
| | | | 361/42 |
| 2016/0087679 A1 | 3/2016 | Behrends | |
| 2019/0079132 A1 | 3/2019 | Chine et al. | |
| 2023/0184848 A1* | 6/2023 | Nagawaram | H02H 3/167 |
| | | | 324/509 |

FOREIGN PATENT DOCUMENTS

| | | |
|---|---|---|
| CN | 101666837 | 3/2013 |
| CN | 103003707 | 3/2013 |
| CN | 103250316 | 8/2013 |
| CN | 103378581 | 10/2013 |
| CN | 206671431 | 11/2017 |
| EP | 3 214 453 | 9/2017 |
| IN | 20174402074 | 2/2018 |
| JP | 2002-290288 | 10/2002 |

OTHER PUBLICATIONS

Int'l Prelim. Exam Report (Form PCT/IPEA/409) conducted in Int'l Appln. No. PCT/EP2019/076028 (dated Dec. 21, 2020).
Translation: China First Office Action conducted in counterpart China Appln. No. 201980063368.3 (dated Jun. 30, 2023).
Wu et al., "Arc Fault Type Identification and Circuit Protection in Photovoltaic System," *Proceedings of the CSEE*, vol. 37, No. 17 (Sep. 5, 2017).

\* cited by examiner

AFCI SELF TEST

The present invention relates to a method for detecting a fault in an arrangement comprising a transformer that has a primary winding connected in series with a DC voltage line and a secondary winding coupled magnetically to the primary winding, and comprising an evaluation unit that processes a secondary signal on the secondary winding. Furthermore, the present invention relates to an arrangement comprising a transformer having a primary winding connected in series with a DC voltage line and a secondary winding coupled magnetically to the primary winding, and comprising an evaluation unit that is designed to processed a secondary signal on the secondary winding.

In DC voltage systems, a DC voltage is provided by at least one DC voltage source and transmitted to a DC voltage sink via DC voltage lines. For example, a number of solar panels or solar cells of a photovoltaic system or a battery can be provided as DC voltage sources. The DC voltage is generated on the solar panels or solar cells depending on solar radiation. An inverter, for example, can act as a DC voltage sink. An inverter converts the DC voltage into an AC voltage and can feed this into an electrical supply network or provide the generated AC voltage to an electrical load, such as an electrical machine or a battery.

In many arrangements, communication with the existing DC voltage sources and/or DC voltage sinks is desirable. Communication signals transmitted by a control unit can be used, for example, to synchronize individual solar panels. Communication signals can also be used to switch off DC voltage sources or other elements of the arrangement, in particular when a fault occurs. Communication signals can thus be transmitted, for example, via specially provided communication lines or directly via the existing DC voltage line by means of so-called power line communication (PLC). In power line communication, it is known that PLC signals are modulated and transmitted as a basic signal at a PLC frequency on the DC voltage available for energy transmission. Transformers can thus be used to couple and/or decouple the PLC signals on the DC voltage line, a primary winding being connected in series with the DC voltage line. The transformer transforms an alternating primary signal flowing through the primary winding to an alternating secondary signal flowing in the secondary winding and vice versa. A PLC receiving unit or PLC transmitting unit is also connected to the secondary winding for receiving or transmitting the PLC signal. Further receiving units or transmitting units can be located on DC voltage sources and/or DC voltage sinks connected to the DC voltage line.

A transformer can also be used for the recognition of an arc if an arc detection unit is connected to the secondary winding of the transformer. If an arc occurs, an arc signal is transformed as part of the primary signal by the transformer from the primary winding to the secondary signal on the secondary winding. The arc detection unit analyzes the secondary signal and recognizes a signal part with a specific arc frequency or signal parts with different arc frequencies of an arc signal transformed by the transformer to the secondary side. This allows conclusions to be drawn about an occurrence of an arc. A transformer that is already available for the PLC communication can also be used for arc recognition if the arc signal on the secondary side can be distinguished from the transmitted PLC signal.

However, it is often necessary that an arrangement comprising the transformer and an evaluation unit is free of faults, for example to ensure that the arc recognition and/or the PLC communication works.

It is therefore an object of the present invention to recognize a fault in an arrangement comprising a transformer for transforming a primary signal of a DC voltage line into a secondary signal and comprising an evaluation unit for evaluating the secondary signal.

This object is achieved according to the invention by a method and a fault detection unit, a signal component at at least one frequency being determined from the secondary signal, a signal level of the signal component being compared with a signal threshold and the fault in the arrangement being detected when the signal level falls below the signal threshold. The arrangement, in particular the transformer, or part of the evaluation unit, can thus be checked for faultlessness. If, for example, the primary winding and/or the secondary winding of the transformer is defective, the signal level of the signal component is below the signal threshold at at least one specific frequency. If this is detected according to the invention, then conclusions about a fault in the arrangement can be drawn. A faulty evaluation unit, for example a defective amplifier, can also be present as a fault. Different signal thresholds can of course be provided for different frequencies.

The transformer can decouple an alternating primary signal from the DC voltage line via a primary winding connected in series with a DC voltage line and transform it onto a secondary winding. Equally, the transformer can also transform an alternating secondary signal to an alternating primary signal on the primary winding and couple it into the DC voltage line.

Advantageously, at least one noise frequency of the fault-free arrangement that typically occurs on the secondary winding is used as at least one frequency.

In this way, noise at a noise frequency can be viewed as a signal component. If the signal level (the noise level) falls below a signal threshold at the at least one frequency (the noise frequency), conclusions about a fault can be drawn. Noise is thus used positively in that the absence of noise in the secondary signal is used as an indicator of a fault in the arrangement. The source of a typical noise with a noise frequency can be the DC voltage sink, for example.

A noise level of the fault-free arrangement occurring at the typically occurring noise frequency is preferably used as the signal threshold. However, the signal threshold can also be set in a range greater than zero and less than a noise level of the fault-free arrangement occurring at the typically occurring noise frequency.

The signal component can be determined at a plurality of frequencies of a frequency band and the signal level can be compared in each case at the plurality of frequencies with a signal threshold. The signal component thus comprises a plurality of frequencies, the signal level at these several frequencies being compared with a signal threshold (which can, but does not have to be, identical for the plurality of frequencies). If a signal level falls below a signal threshold, conclusions about a fault can be drawn.

The signal component is advantageously determined at a plurality of frequencies in a frequency band, a mean value of the signal levels at the plurality of frequencies is formed and compared with a signal threshold. With this averaging, interference on a frequency in the frequency band can be ignored. Otherwise, such an interference could cause the signal level at this frequency to fall below the signal threshold, although no fault occurs. By considering all signal levels of the frequencies in the frequency band and the averaging, the total energy content in the frequency band is observed and evaluated.

The frequency band preferably ranges from 0 Hz to a limit frequency, preferably 40 kHz.

The signal component is advantageously determined when the arrangement is started. This ensures that the evaluation unit and the transformer function correctly during commissioning and that no faults occur. Of course, the signal component or the level of the signal component can also be determined when the arrangement is in operation.

The evaluation unit can be represented by the fault recognition unit itself or it can comprise the fault recognition unit.

The evaluation unit can comprise an arc detection unit and/or a PLC receiving unit which is designed to receive an arc signal and/or a PLC reception signal transformed by the transformer from the primary winding to the secondary winding.

The evaluation unit can also be part of an arc detection unit and/or a PLC receiving unit which is designed to receive an arc signal and/or PLC reception signal transformed by the transformer from the primary winding to the secondary winding. An arc detection unit and/or a PLC receiving unit can therefore comprise an evaluation unit according to the invention.

A transmitting unit can also be provided which is connected to the secondary winding of the transformer and is designed to transmit a PLC transmission signal to the secondary winding. The transformer is then designed to transform the PLC transmission signal from the secondary winding to the primary winding. A receiving unit on a DC voltage source or DC voltage sink can recover and evaluate the modulated PLC transmission signal by demodulation.

The DC voltage line can be provided for transmitting a DC voltage from at least one DC voltage source to at least one DC voltage sink.

The at least one DC voltage source can comprise at least one photovoltaic cell and the at least one DC voltage sink can comprise at least one inverter.

A further signal component at at least one further frequency is preferably determined from the secondary signal and a signal level of the further signal component is compared with an upper signal threshold. The fault in the arrangement is detected when the signal level exceeds the upper signal threshold.

The at least one further frequency can correspond to the at least one frequency, so that the further signal component corresponds to the signal component.

In the following, the present invention is described in greater detail with reference to FIGS. 1 to 6 which, by way of example, show schematic and non-limiting advantageous embodiments of the invention. In the drawings

FIG. 1a to 4 each show a DC voltage source 2 and a DC voltage sink 6, which are connected to one another via a positive DC voltage line DC+ and a negative DC voltage line DC−. The DC voltage source 2 can, for example, comprise one or more solar cells and provides energy which is transmitted to the DC voltage sink 6 as DC voltage U_dc. The DC voltage sink 6 can, for example, comprise an inverter, a rectifier, a step-up and/or step-down converter, a DC-DC converter, a bidirectional converter, etc. and can be used to feed into an energy supply network or to supply energy to a load. An electrical load can, of course, also be considered to be the DC voltage sink 6 directly. In particular in photovoltaic systems, different configurations of DC voltage sources 2 and DC voltage sinks 6 can be provided; for example, each solar panel can be connected as a DC voltage source 2 to an inverter as a DC voltage sink 6 via a DC voltage line DC+, DC−. A plurality of DC voltage sources 2 and/or DC voltage sinks 6 can also share parts of the DC voltage lines DC+, DC−. Solar panels can also be connected to one another in series and/or in parallel as a DC voltage source 2. Various configurations of DC voltage sources 2, DC voltage sinks 6 and DC voltage lines DC+, DC− are thus conceivable, whereby the invention is not restricted to the configuration in the drawings. When using batteries, the batteries can be considered to be DC voltage sources 2 or DC voltage sinks 6, depending on whether the batteries are being discharged or charged. For example, depending on the operating mode, an inverter or charger can be used as a DC voltage source 2 for a battery as a DC voltage sink 6, or a battery can be used as a DC voltage sink 6 for an inverter or a charger as a DC voltage source 2.

An arrangement 1 according to the invention is also provided in FIG. 1a to 4, which comprises a transformer 4, an evaluation unit 5, and a fault detection unit 7. The transformer 4 comprises a primary winding L1 on a primary side and a secondary winding L2 on a secondary side. The primary winding L1 is connected in series with the negative DC voltage lines DC−; the secondary winding L2 is connected to an evaluation unit 5. The primary winding L1 could of course also be connected to the positive DC voltage line DC+.

An alternating primary signal i1 flowing through the primary winding L1, preferably a primary current, is transformed in normal operation via the transformer 4 to an alternating secondary signal i2 flowing through the secondary winding L2, preferably a secondary current i2, and vice versa. The transformer 4 advantageously has a transformation ratio of 1:1, 1:2 or 1:4 from the primary side to the secondary side. Furthermore, the communication transformer 4 can have a ferrite core, e.g., a Hiflux core, preferably having a particularly advantageous saturation behavior for direct currents.

The evaluation unit 5 is designed to evaluate the secondary signal i2, which is applied to the secondary winding L2. Thus, for example a PLC reception signal Rx(fx) and/or an arc signal arc(f_arc) transformed by the transformer 4 from the primary winding L1 to the secondary winding L2 can be received and processed, as described further below with reference to FIGS. 2 and 3.

In the drawings, it is assumed by way of example that the transformer 4 has a transformation ratio of 1:1, so that when the transformer 4 is functional, the primary signal i1 corresponds to the secondary signal i2. The primary signal i1 and the secondary signal i2 are therefore fundamentally identical with a functioning transformer 4, which means that the frequencies fn, arc frequencies f_arc, PLC frequencies fx, etc., are identical on the primary and secondary sides; this was, however, only assumed for the sake of simplicity.

According to the invention, the secondary winding L2 of the transformer 4 is connected to a fault detection unit 7. The fault detection unit 7 can represent part of the evaluation unit 5 or can also be viewed as an evaluation unit 5 itself. The fault detection unit 7 determines a signal component n(fn) at at least one frequency fn from the secondary signal i2. The signal component i2(fn) has a signal level P(fn), which is compared with a signal threshold P_min(fn). A fault F is detected in the arrangement 1 when the signal level P(fn) falls below the signal threshold P_min(fn). A defect F can occur, for example, in the primary winding L1, the secondary winding L2, or also in the evaluation unit 5 or the fault detection unit 7.

A typically occurring noise component of the secondary signal i2 of the fault-free arrangement 1 is advantageously considered as the signal component n(fn). The at least one frequency fn thus corresponds to a noise frequency typically occurring on the secondary winding L2. Accordingly, a noise level that is to be expected, because it occurs typically, in the fault-free arrangement 1 at the at least one frequency fn (i.e., the noise frequency) can be used as the signal threshold P_min(fn). The signal threshold (P_min(fn)) can also be set in a range greater than zero and less than a noise level of the fault-free arrangement 1 occurring at the typically occurring noise frequency.

In FIGS. 1a to 4, the signal component n(fn) is shown by way of example as an arrow in the negative DC voltage line DC−. In the drawings, the signal component n(fn) is thus transformed from the primary winding L1 to the secondary winding L2. Of course, the signal component n(fn) could also arise partly (for example at specific frequencies fn) or completely on the secondary side, for example on the secondary winding L2 or in the evaluation unit 5.

Figure 1A:
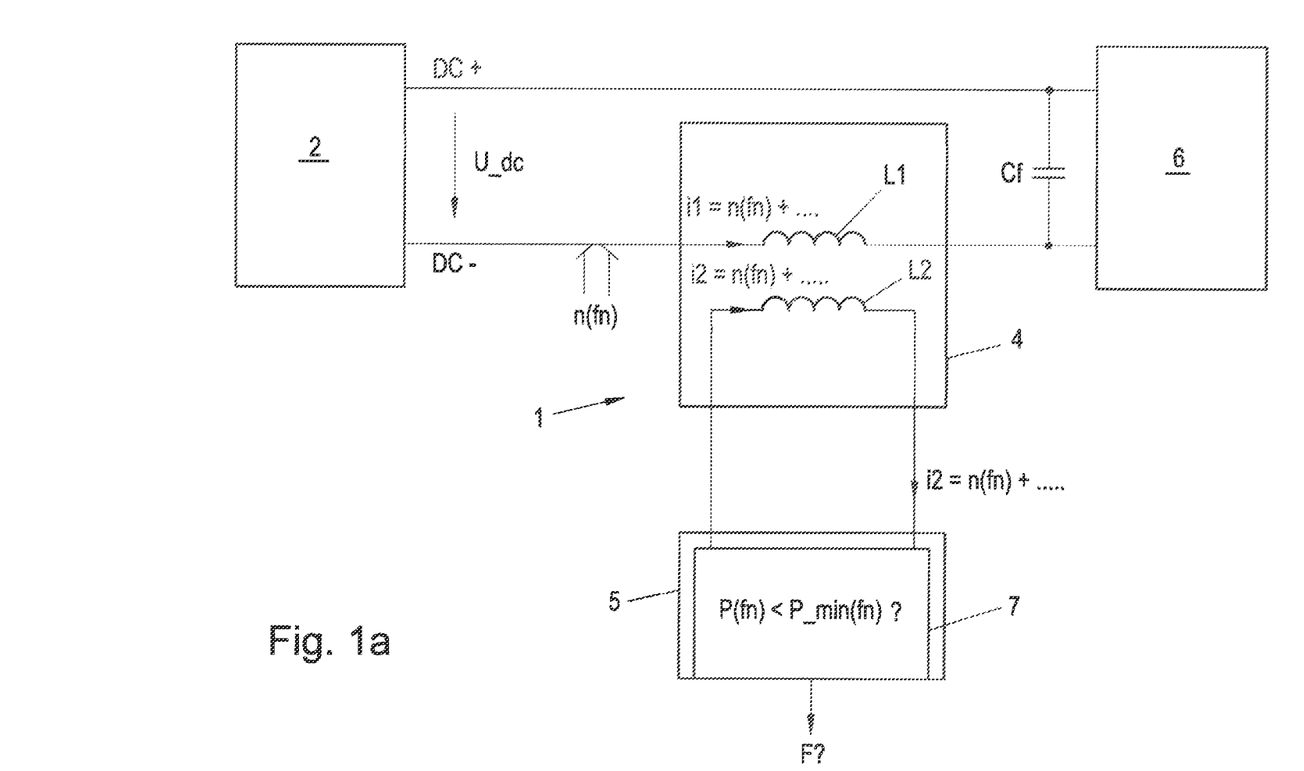
FIG. 1a shows an arrangement according to the invention without occurring faults.

If no fault F occurs in the arrangement 1, the signal component n(fn) at the at least one frequency fn has a signal level P(fn) above the signal threshold P_min(fn), as shown in FIG. 1a. No fault F is thus detected.

Figure 1B:
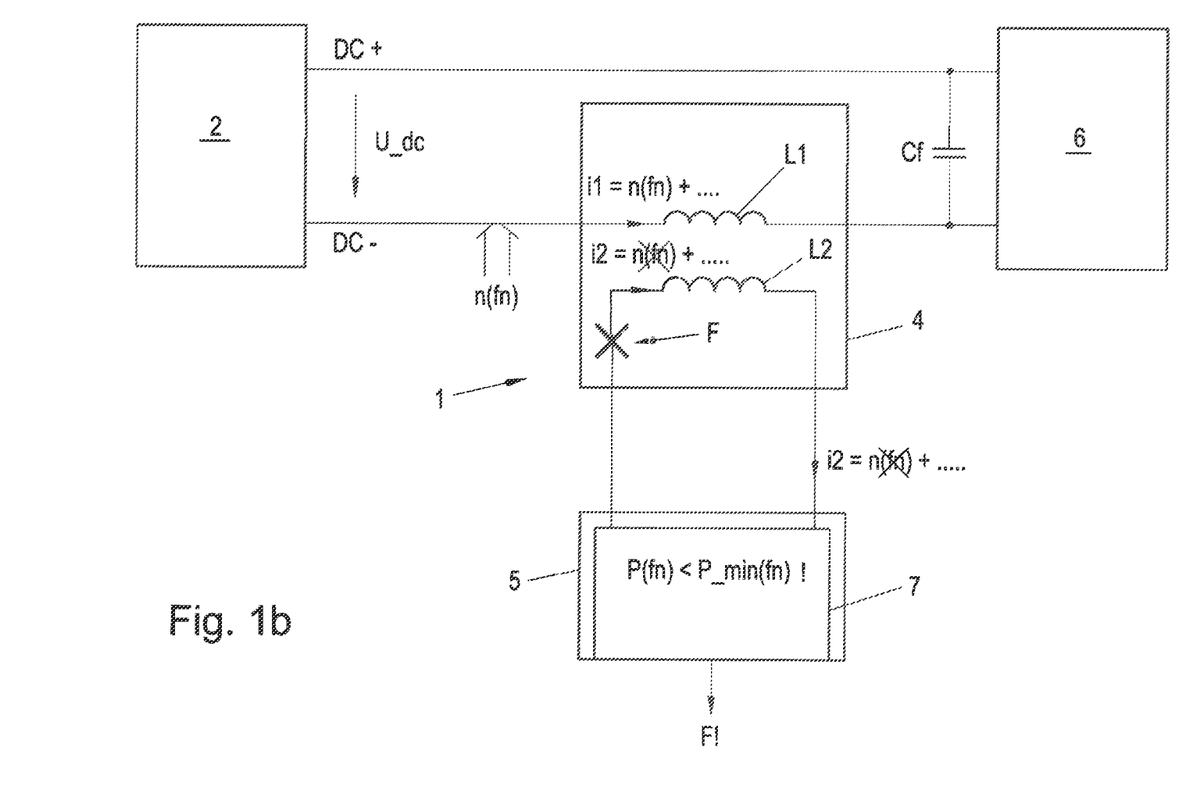
FIG. 1b shows an arrangement according to the invention with a fault occurring.

If, as shown in FIG. 1b, a fault F occurs in the arrangement 1, the signal component n(fn) has a signal level P(fn) below the signal threshold P_min (f2). In FIG. 1a, the signal component n(fn) is no longer contained in the secondary signal i2, for example, since the line of the secondary winding L2 is interrupted (actually the entire secondary signal i2 is thus interrupted in this case). In this way, conclusions about the presence of a fault F can be drawn in the fault detection unit 7.

Figure 2:
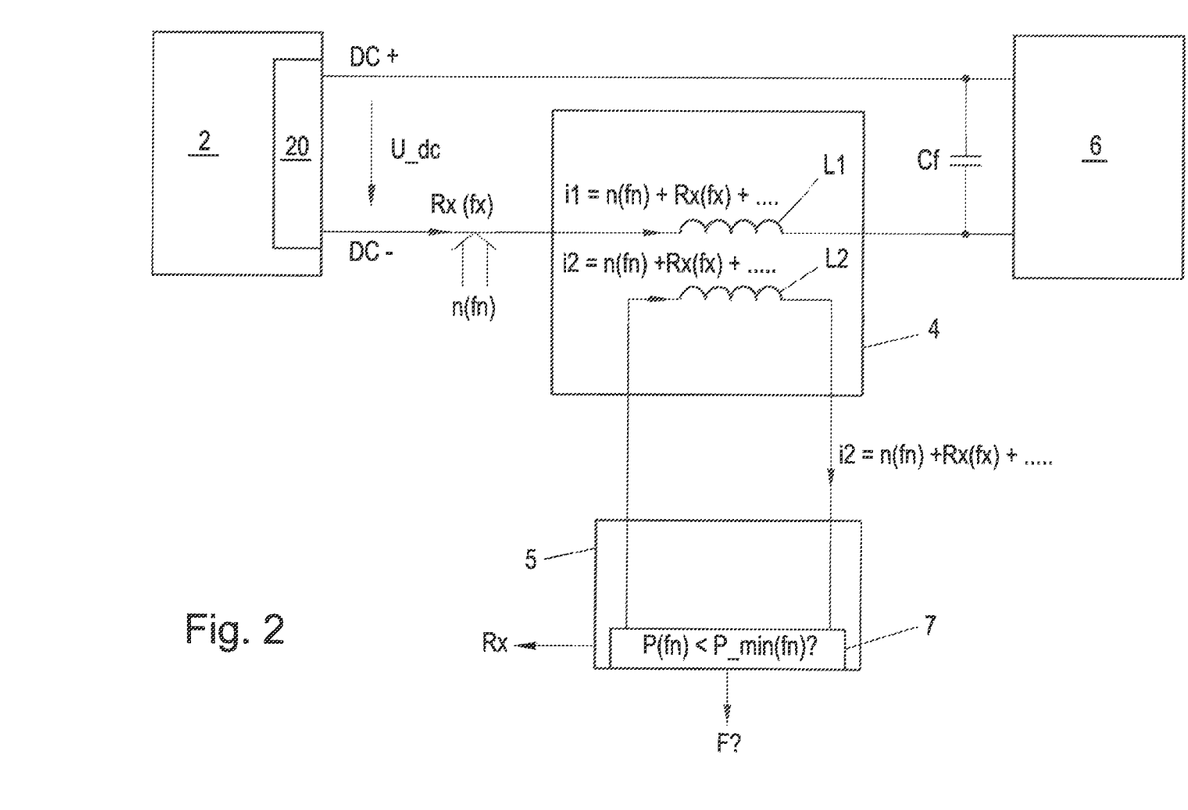
FIG. 2 shows an arrangement suitable for receiving a PLC reception signal.

The fault recognition unit 7 according to the invention can be combined with various transformers 4. For example, the transformer 4, as shown in FIG. 2, can be provided as a PLC transformer. A PLC reception signal Rx(fx) with a PLC frequency fx is thus first transformed from the primary winding L1 to the secondary winding L2 via the transformer 4 and received by a PLC receiving unit, for example as part of the evaluation unit 5.

Figure 3:
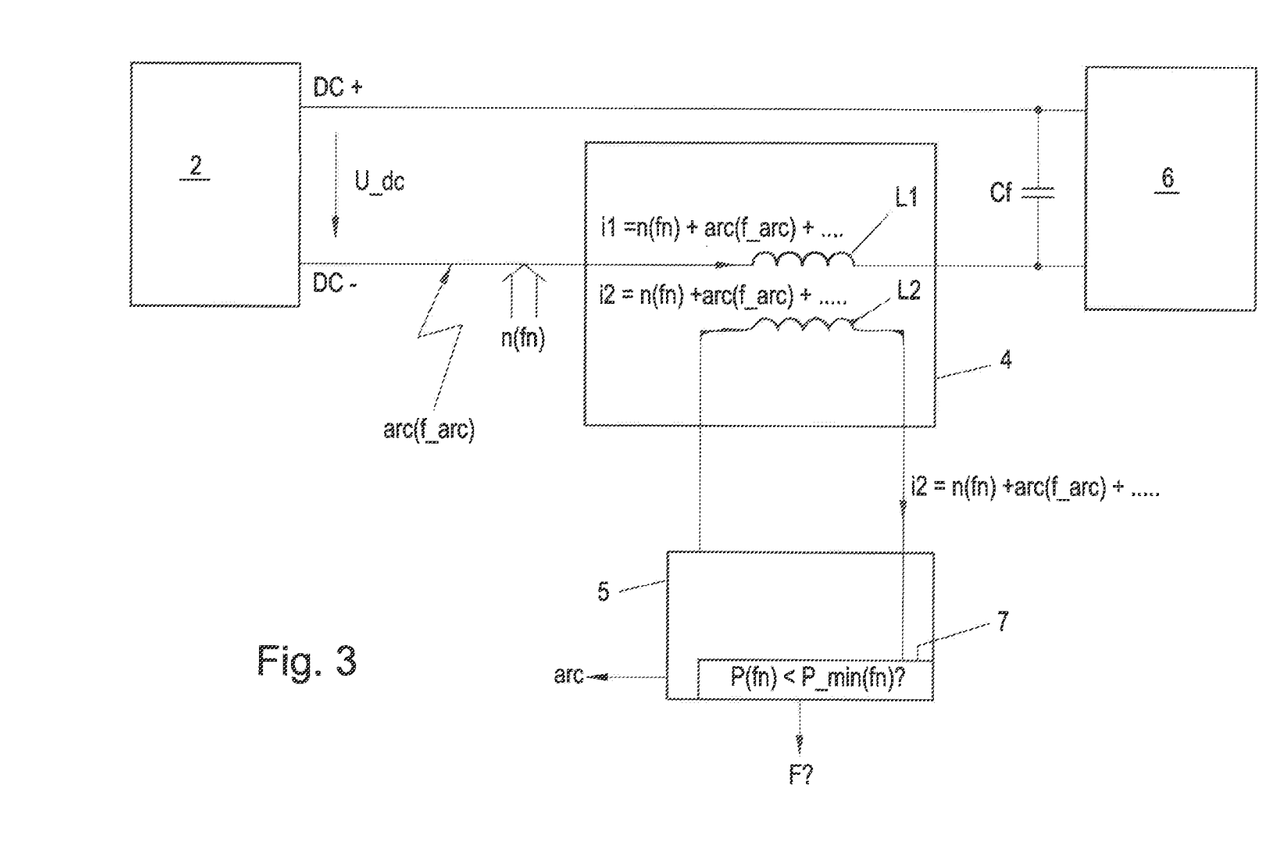
FIG. 3 shows an arrangement suitable for the detection of an arc.

The transformer 4 can also be used for the recognition of an arc, as shown in FIG. 3. If an arc forms in a DC voltage source 2, a DC voltage sink 6, a DC voltage line DC+, DC− of a plug connection of the DC voltage line DC+, DC−, or the like, an arc signal arc(f_arc) with the arc frequency f_arc is generated in the DC voltage line DC+, DC−. The arc frequency f_arc extends, for example, over a frequency spectrum from 5 kHz to 200 kHz. The primary signal i1 thus comprises the arc signal arc(f_arc). For example, in FIG. 3 the arc "arc" is identified as a lightning bolt in the negative DC voltage line DC−. The transformer 4 transforms the primary signal i1 to the secondary signal i2, which thus also comprises an arc signal arc(f_arc). The evaluation unit 5 thus comprises an arc detection unit and can recognize the arc signal arc(f_arc) in the secondary signal i2 when an arc occurs. This allows conclusions to be drawn about the presence of an arc "arc".

The recognition of the fault F can be carried out for an arrangement 1 with an evaluation unit 5 comprising an arc detection unit and/or a PLC receiving unit in a manner analogous to that described in FIG. 1a, b—in particular if no PLC reception signal Rx or arc signal arc(f_arc) is received.

If, however, a PLC reception signal Rx(fx) is received, the secondary signal i2 naturally comprises the PLC reception signal Rx(fx). It makes sense that the PLC reception signal Rx(fx) has a PLC frequency fx which differs from the at least one frequency fn in order not to interfere with the fault recognition with the PLC frequency fx. This prerequisite is already given, in particular, if a noise frequency is used as at least one frequency fn in order to avoid PLC communication taking place in the frequency range of the noise. In addition, in the event of a fault, such as an interruption in a line or winding of the transformer 4, neither a PLC reception signal Rx(fx) nor a signal component n(fn) is present in the secondary signal i2, which means that conclusions can be drawn quickly about a fault F.

It is also advantageous for the arc recognition when an arc "arc" does not interfere with the fault recognition, i.e. the arc frequency f_arc of the arc signal arc(f_arc) is not in the range of the at least one frequency fn. But even if an arc signal arc(f_arc) is in the signal component n(f), a recognition of the fault F would be possible if, in the case of a fault F, the signal level P(fn) of the signal component n(fn) is below the signal threshold P_min(fn). A detection of an arc "arc" might not be possible, in particular if a winding of the transformer 4 or a line is broken and defective and thus that the arc signal arc(f_arc) does not arrive at the evaluation unit 5. According to the invention, however, this fault is recognized by the fault recognition unit 7, which is also possible when the arrangement is in operation.

Figure 4:
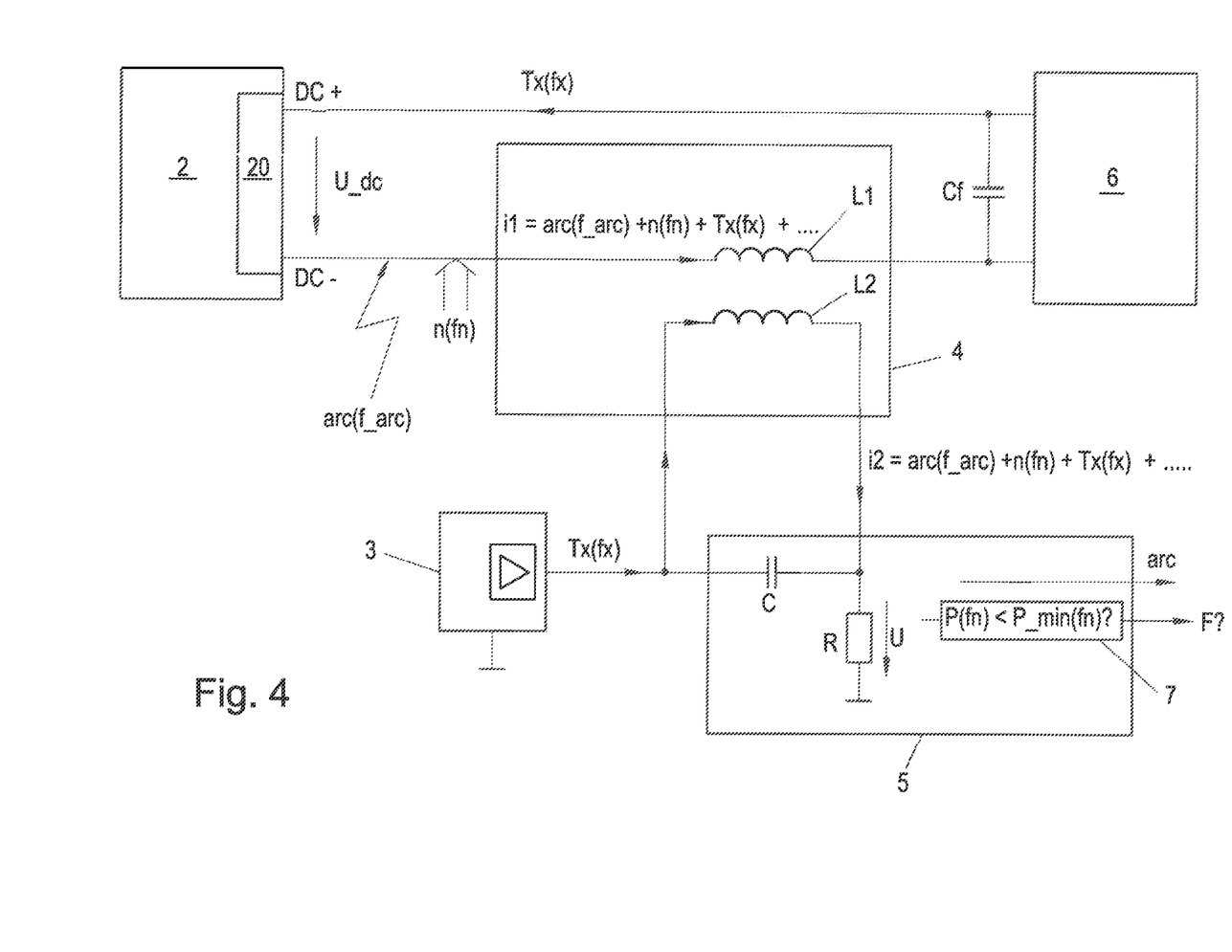
FIG. 4 shows an arrangement suitable for transmitting a PLC reception signal and for detecting an arc.

A transmission device 3 connected to the secondary winding L2 can also be provided in order to transmit a PLC transmission signal Tx(fx) with a PLC frequency fx, as shown in FIG. 4. The PLC transmission signal Tx(fx) is modulated onto the secondary signal i2 and transformed by the transformer 4 to the primary signal i1. The primary signal i1 is coupled into the DC voltage line DC+, DC− and is transmitted via the DC voltage lines DC+, DC− to the DC voltage source 2 and/or the DC voltage sink 6 and received and demodulated by a receiving unit 20 provided on the DC voltage source 2 and/or the DC voltage sink 6. Even when the PLC transmission signal Tx is transmitted via the DC voltage lines DC+, DC−, a filter capacitance Cf can be used in or on the DC voltage sink 6 in order to loop through the PLC transmission signal Tx. The PLC transmission signals Tx(fx) can be, for example, pulses for detecting interference points, signals for measuring impedance, interference level measurement signals, synchronization signals for individual current sources 2, such as solar cells, or also control signals.

PLC frequencies fx for PLC reception signals Rx(fx) as well as for PLC transmission signals Tx(fx) are usually in the frequency spectrum from 125 kHz to 145 kHz, for example 131.25 kHz and 143.75 kHz.

An arrangement 1 with a fault detection unit and an evaluation unit 5 for the recognition of an arc "arc" is particularly advantageous, a transmitting unit 3 additionally being provided for transmitting a PLC transmission signal Tx(fx). The transformer 4 can thus be used for PLC communication as well as for the detection of an arc "arc". It is possible to transmit a PLC transmission signal Tx(fx)

through the transmission device 3 and at the same time to recognize an arc "arc" by an arc detection unit, for example as part of the evaluation unit 5. FIG. 4 shows an advantageous embodiment of the invention which allows an arc "arc" to be recognized via an arc signal arc(f_arc) and a PLC transmission signal Tx(fx) to be transmitted, a fault recognition 7 also being implemented. The primary winding L1 is connected to the DC voltage line DC+, DC−. The secondary winding L2 is connected to the evaluation unit 5, which, in this case, basically represents an arc recognition unit and comprises the fault detection unit 7. In order to attenuate the PLC transmission signal Tx(fx) with respect to the arc signal arc(f_arc), for example a resistor R and a capacitor C which is connected in series and has a preferred magnitude of 70 to 120 nF are provided, it being possible to provide a base frequency in the kHz range, preferably 130 kHz. The capacitor C is connected in parallel to the secondary winding L2. The evaluation unit 5 further comprises a resistor R in order to convert the secondary signal i2 to a voltage U present at the resistor R and to process it for the recognition of the arc "arc". Likewise, the secondary signal i2 via the voltage U is used for the recognition of the fault F in that the signal level P(fn) of the signal component n(fn) at the at least one frequency fn is considered and compared with the signal threshold P_min(fn).

Since the transmitting unit 3 is also connected in series with the secondary winding, a resonance circuit is generated which, from the point of view of the evaluation unit 5 (including the fault recognition unit 7), causes a PLC transmission signal Tx(fx) attenuated by up to 1/10 compared to the signal part n(fn), and the arc signal arc(f_arc). Reliable recognition of an arc "arc", as well as a fault F, is thus possible, in particular when a PLC transmission signal Tx(fx) is transmitted. The embodiment shown in FIG. 4 is of course also possible without an arc recognition. A transformer 4, which has a transmitting unit 3 connected to the secondary winding L2 for PLC communication, can thus also be tested for function or fault F without the presence of an arc detection unit. The signal component n(fn) can of course also arise from noise in the evaluation unit 5 itself. This means that a fault in the evaluation unit can also be inferred.

Figure 5:
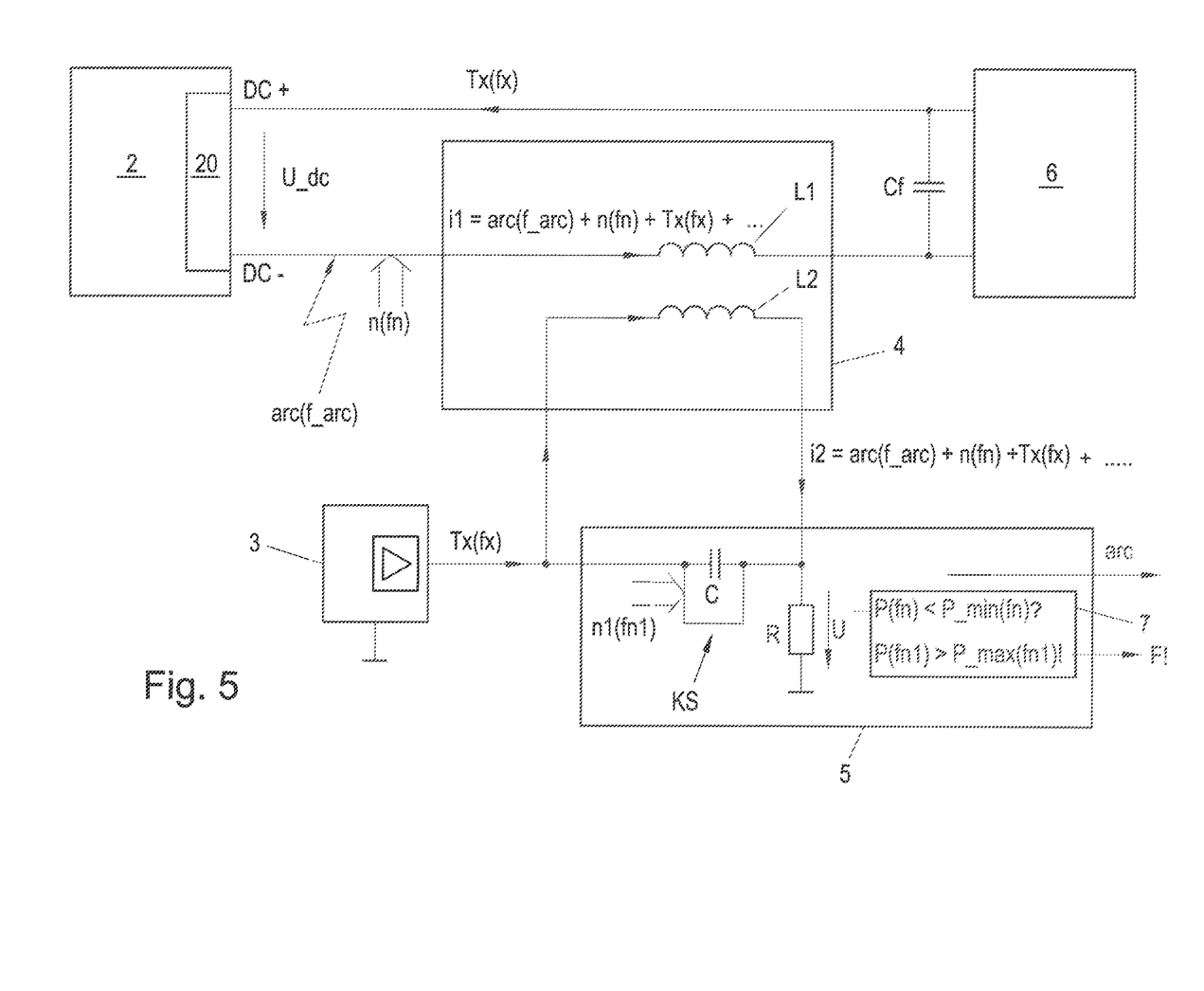
FIG. 5 shows an arrangement suitable for transmitting a PLC reception signal and for detecting an arc with an occurring short circuit.

A further signal component nl(fn1) at at least one further frequency fn1 can be determined from the secondary signal i2 and a signal level P(fn1) of the further signal component nl(fn1) can be compared with an upper signal threshold P_max(fn1). A fault F is detected in the arrangement 1 when the signal level P(fn1) exceeds the upper signal threshold P_max(fn1). FIG. 5 shows a faulty arrangement 1 which has a short circuit KS in the capacitor C of the evaluation unit 5 as a fault F. In this case, the short circuit KS also shorts the secondary winding L2. Because of the short circuit KS, the signal level P(fn1) of a further signal part nl(fn1) at a further frequency fn1 is above an upper signal threshold P_max (fn1) and conclusions can be drawn about a fault F, in this case the short circuit KS. The short circuit KS of the capacitor C is of course only listed as an example; further short circuits KS or other types of faults in the evaluation unit 5 or other elements of the device 1 can also be recognized.

The signal threshold P_min(fn) and/or the upper signal threshold P_max(fn1) can vary for different frequencies fn or further frequencies fn1, in particular if it can be assumed that faults F affect the levels P(fn), P(fn1) at different frequencies fn, or other frequencies fn1 differently. If the further frequency fn1 corresponds to the frequency fn, no fault is detected if the signal level P(fn), P(fn1) lies between the lower signal threshold P_min(fn) and the upper signal threshold P_max(fn1). If the signal level P(fn), P(fn1) is below the lower signal threshold P_min(fn) or above that of the upper signal threshold P_max(fn1), a fault F is detected.

It can also be assumed that different types of faults F in the arrangement 1 can lower the signal levels P(fn), P(fn1) of different signal components n(fn) at different (further) frequencies fn, fn1. In this way, conclusions about different types of faults F in the arrangement 1 can be drawn in that the levels P(fn), P(fn1) of different (further) signal components n(fn), nl(fn1) at different (further) frequencies fn, fn1 are compared with the signal thresholds P_min(fn) or the upper signal threshold P_max(fn1).

Figure 6:
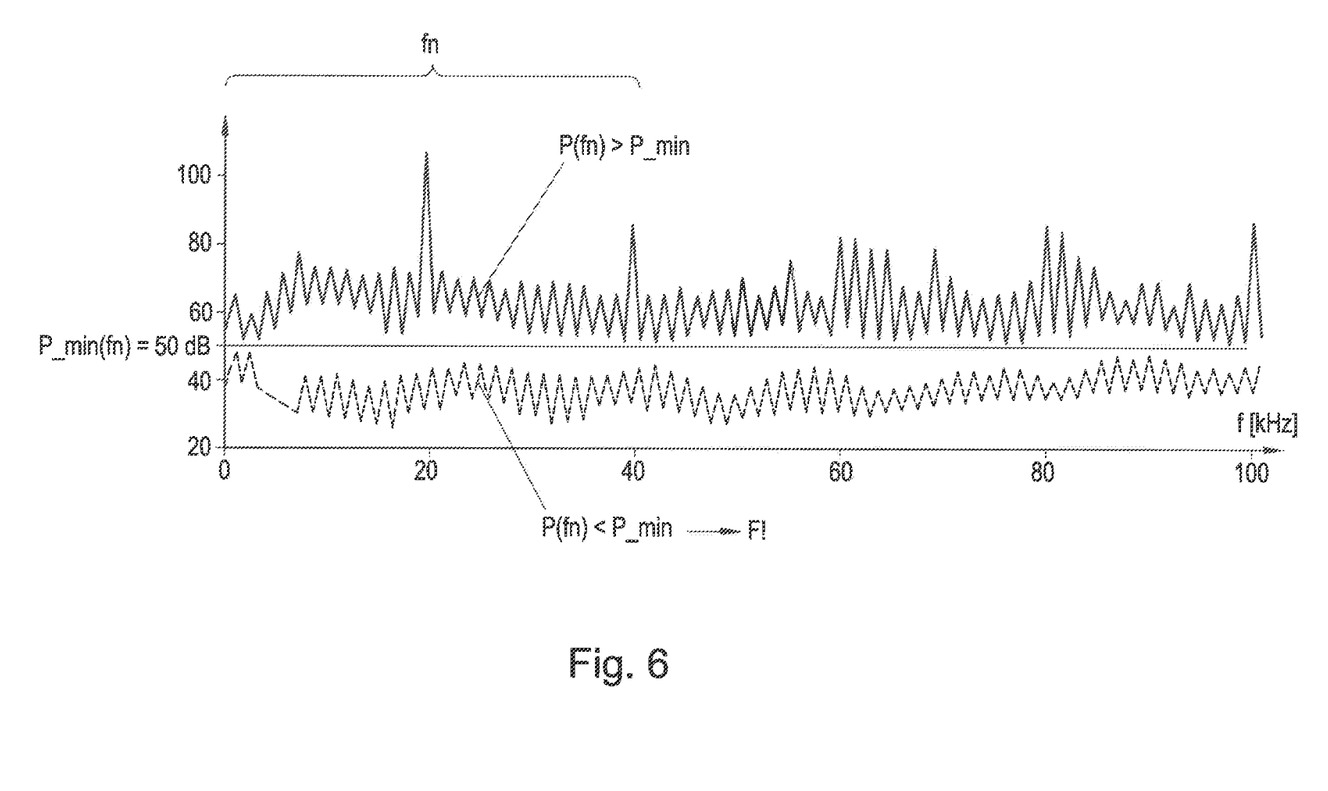
FIG. 6 shows a typical frequency range of the secondary signal.

FIG. 6 shows a typical profile of the secondary signal i2 in the frequency range. For example, the frequency band from 0 to 40 kHz is provided as the limit frequency as the signal component n(fn). The secondary signal i2 is shown in solid lines without any fault F occurring. It can be seen that the signal component n(fn) in this case is above the signal threshold P_min(fn) for all frequencies fn, which means that conclusions can be drawn that no fault F is occurring in the arrangement 1.

The secondary signal i2 in the case of an occurring fault F is shown in broken lines. The signal component n(fn) of the secondary signal i2 has a lower signal level P(fn) compared to the signal component n(fn) without a fault F in the case of an occurring fault F. The signal level is thus below the signal threshold P_min(fn) at all frequencies fn. Thus, conclusions can be drawn that a fault F occurs in the arrangement 1.

The mean value of the signal levels P(fn) of the frequencies fn of the frequency band can be formed and the mean value can be compared with the signal threshold P_min(fn) in order to average out interferences of individual frequencies fn. Thus, it is not the signal levels (P(fn) of individual frequencies fn that are considered and evaluated, but the total energy content in the frequency band. The mean value can be an arithmetic mean value, a median, or the like.

Of course, the primary signal i1 and the secondary signal i2 can include, in addition to the signal component n(fn), the arc signal arc(f_arc), the PLC transmission signal Tx(fx), and the PLC reception signal Rx(fx), further components of alternating currents, e.g. further signals, interferences, etc.

The invention claimed is:

1. A method for detecting a fault in an arrangement comprising a transformer that has a primary winding which can be connected in series with a DC voltage line and a secondary winding coupled magnetically to the primary winding, and comprising an evaluation unit that processes a secondary signal on the secondary winding, wherein a signal component at at least one frequency is determined from the secondary signal and a signal level of the signal component is compared with a signal threshold, and wherein the fault is detected in the arrangement when the signal level falls below the signal threshold, at least one noise frequency typically occurring on the secondary winding of the fault-free arrangement being used as at least one frequency (fn).

2. The method according to claim 1, wherein a noise level of the fault-free arrangement occurring at the typically occurring noise frequency is used as the signal threshold.

3. The method according to claim 2, wherein the signal threshold is set in a range greater than zero and less than a noise level of the fault-free arrangement occurring at the typically occurring noise frequency.

4. The method according to claim 1, wherein the signal component is determined at a plurality of frequencies of a frequency band and the signal level at the plurality of frequencies in each case is compared with a signal threshold.

5. The method according to claim 1, wherein the signal component is determined at a plurality of frequencies of a frequency band, a mean value or a median of the signal levels is formed at the plurality of frequencies and is compared with a signal threshold.

6. The method according to claim 4, wherein the frequency band ranges from 0 Hz to a limit frequency, preferably 40 kHz.

7. The method according to claim 1, wherein the signal component is determined when the arrangement is started.

8. The method according to claim 1, wherein the evaluation unit receives and evaluates a PLC reception signal and/or an arc signal transformed by the transformer from the primary winding to the secondary winding.

9. The method according to claim 1, wherein a PLC transmission signal is transmitted from a transmitting unit to the secondary winding and is transformed from the secondary winding to the primary winding.

10. The method according to claim 1, wherein a further signal component at at least one further frequency is determined from the secondary signal and a signal level of the further signal component is compared with an upper signal threshold, and in that the fault is detected in the arrangement when the signal level exceeds the upper signal threshold.

11. The method according to claim 10, wherein the further frequency corresponds to the frequency.

12. An arrangement comprising a transformer having a primary winding which can be connected in series with a DC voltage line, having a secondary winding coupled magnetically to the primary winding, and comprising an evaluation unit that is designed to processed a secondary signal on the secondary winding, wherein a fault recognition unit is provided, which is connected to the secondary winding, and is designed to determine a signal component at at least one frequency, which corresponds to at least one noise frequency typically occurring on the secondary winding of the fault-free arrangement, from the secondary signal and to compare a signal level of the signal component with a signal threshold, and to detect a fault in the arrangement when the signal level falls below the signal threshold.

13. The arrangement according to claim 12, wherein the evaluation unit comprises an arc detection unit and/or a PLC receiving unit which is designed to receive an arc signal and/or PLC reception signal transformed by the transformer from the primary winding to the secondary winding.

14. The arrangement according to claim 12, wherein the evaluation unit is part of an arc detection unit and/or a PLC receiving unit which is designed to receive an arc signal and/or PLC reception signal transformed by the transformer from the primary winding to the secondary winding.

15. The arrangement according to claim 12, characterized in that a transmitting unit is provided which is connected to the secondary winding of the transformer and is designed to transmit a PLC transmission signal to the secondary winding, and in that the transformer is designed to transform the PLC transmission signal from the secondary winding to the primary winding.

16. The arrangement according to claim 12, wherein the primary winding is connected in series to the DC voltage line, the DC voltage line being provided for transmitting a DC voltage from at least one DC voltage source to at least one DC voltage sink.

17. The arrangement according to claim 16, wherein the at least one DC voltage source comprises at least one photovoltaic cell, and in that the at least one DC voltage sink comprises at least one inverter.

* * * * *